United States Patent [19]

Noda et al.

[11] Patent Number: 4,642,573

[45] Date of Patent: Feb. 10, 1987

[54] PHASE LOCKED LOOP CIRCUIT FOR DEMODULATING SUPPRESSED CARRIER SIGNALS

[75] Inventors: Tsutomu Noda; Keiro Shinkawa; Nobutaka Amada, all of Yokohama, Japan

[73] Assignee: Hitachi, Ltd., Tokyo, Japan

[21] Appl. No.: 783,521

[22] Filed: Oct. 3, 1985

[30] Foreign Application Priority Data

Oct. 5, 1984 [JP] Japan .............................. 59-208188
Oct. 31, 1984 [JP] Japan .............................. 59-227721
Oct. 31, 1984 [JP] Japan .............................. 59-227724

[51] Int. Cl.$^4$ ..................... H03D 1/24; H03D 3/02; H04L 27/22
[52] U.S. Cl. ................................. 329/50; 329/124; 370/11; 370/100; 375/77; 375/81; 375/88; 375/120; 455/202; 455/260

[58] Field of Search .................. 329/50, 122, 124; 375/81, 82, 83, 86, 94, 120, 77; 370/11, 77, 86, 100; 455/260, 262, 265, 202

[56] References Cited

U.S. PATENT DOCUMENTS 4,048,566 9/1977 Carson et al. ................... 455/265 X Primary Examiner—Siegfried H. Grimm
Attorney, Agent, or Firm—Antonelli, Terry & Wands

[57] ABSTRACT

A phase locked loop circuit for use in a heterodyne receiver for stably demodulating a carrier-suppressed double-sideband signal such as a 2-phase or 4-phase PSK signal. The phase locked loop circuit comprises a reference oscillator oscillating at a frequency corresponding to an intermediate frequency, and the frequency difference between the reference frequency and the input frequency is detected by a Costas loop, a signal indicative of the frequency difference being fed back to a local oscillator through a loop filter thereby stabilizing the intermediate frequency.

6 Claims, 11 Drawing Figures

PHASE LOCKED LOOP CIRCUIT FOR DEMODULATING SUPPRESSED CARRIER SIGNALS

BACKGROUND OF THE INVENTION

This invention relates to a phase locked loop (PLL) circuit, and more particularly to a PLL circuit in which an intermediate frequency signal can be stably generated during demodulation of a carrier-suppressed double-sideband signal.

In a prior art PLL device such as that disclosed in Japanese Unexamined Patent Publication No. 197944/83, a carrier for coherent detection purpose can be recovered even in a transmission system where a large variation of the carrier frequency tends to occur. Further, in a PLL device disclosed in Japanese Unexamined Patent Publication No. 136160/83, the synchronous detection frequency and phase are controlled to follow up the frequency and phase of an input signal so as to prevent undesirable degradation of the error rate of a demodulated signal. However, in a prior art PLL circuit incorporated in, for example, a heterodyne receiver, a band-pass filter permitting passage of a fixed intermediate frequency is provided in spite of the fact that the intermediate frequency tends to drift due to the tendency of occurrence of a drift of the characteristic of a local oscillator. Thus, an excess or shortage of demodulated sidebands attributable to the provision of the frequency-fixed band-pass filter has not utterly been taken into consideration.

SUMMARY OF THE INVENTION

It is a primary object of the present invention to provide a PLL circuit which, when incorporated in a heterodyne receiver, can stably demodulate a carrier-suppressed double-sideband signal such as a 2-phase or 4-phase phase-shift keying signal which will be referred to hereinafter as a 2-phase or 4-phase PSK signal.

The PLL circuit according to the present invention is characterized in that a reference oscillator oscillating at a reference frequency corresponding to an intermediate frequency is provided, the phase difference between an input frequency and the reference frequency is detected by a Costas loop, a signal indicative of the phase difference is fed back to a local oscillator through a loop filter.

DESCRIPTION OF THE PREFERRED EMBODIMENTS

A first embodiment of the PLL circuit according to the present invention will be in detail described with reference to FIG. 1. In this first embodiment, a double heterodyne system generating two intermediate frequencies is employed to lower the carrier frequency for demodulating a 4-phase PSK signal.

Figure 1:
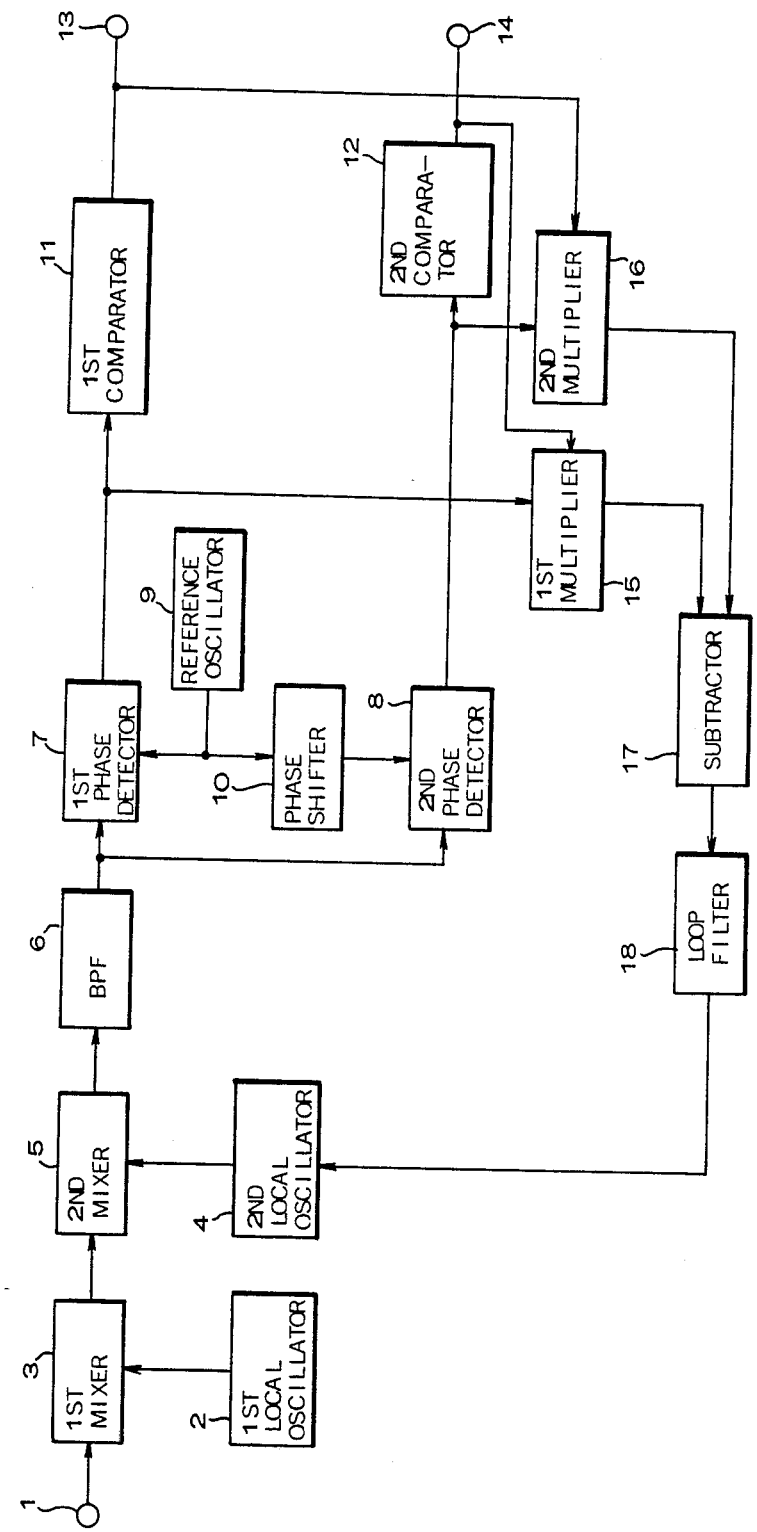
FIG. 1 is a block diagram showing the structure of a first embodiment of the PLL circuit according to the present invention.

Referring to FIG. 1, the PLL circuit comprises an input terminal 1, a first local oscillator 2, a first mixer 3, a second local oscillator 4, a second mixer 5, a band-pass filter 6, a first phase detector 7, a second phase detector 8, a reference oscillator 9, a 90° phase shifter 10, a first comparator 11, a second comparator 12, a first demodulated signal output terminal 13, a second demodulated signal output terminal 14, a first multiplier 15, a second multiplier 16, a subtractor 17 and a loop filter 18.

A 4-phase PSK signal applied to the input terminal 1 is applied to the 1st mixer 3 together with an oscillation output signal of the 1st local oscillator 2 to be beaten down in the 1st mixer 3, and an output signal having a first intermediate frequency appears from the 1st mixer 3. The signal having the first intermediate frequency is applied from the 1st mixer 3 to the 2nd mixer 5 together with an oscillation output signal of the 2nd local oscillator 4 to be beaten down in the 2nd mixer 5, and an output signal having a second intermediate frequency appears from the 2nd mixer 5. The output signal of the 2nd mixer 5 is applied to the band-pass filter 6 where the signal is subjected to waveform equalization so as to eliminate unnecessary out-band noise, interference, etc. and to optimize the characteristics of the transmission line. Such an output signal of the band-pass filter 6 is applied to the 1st and 2nd phase detectors 7 and 8. An oscillation output signal of the reference oscillator 9 is applied directly to the 1st phase detector 7 to be used for coherent detection of the input signal applied to the 1st phase detector 7. The oscillation output signal of the reference oscillator 9 is applied also to the 2nd phase detector 8 through the 90° phase shifter 10 to be used for coherent detection of the input signal applied to the 2nd phase detector 8. As a result, baseband signals representing the phase of 0° and the phase of 90° appear from the 1st and 2nd phase detectors 7 and 8 respectively. These signals are discriminated as +1 or −1 in the 1st and 2nd comparators 11 and 12, and the corresponding binary digital signals appear at the 1st and 2nd demodulated signal output terminals 13 and 14 respectively. In the meantime, the output of the 1st phase detector 7 and the output of the 2nd discrimination circuit 12 are applied to the 1st multiplier 15, and the resultant output of the 1st multiplier 15 is applied as one of inputs to the subtractor 17. Similarly, the output of the 2nd phase detector 8 and the output of the 1st comparator 11 are applied to the 2nd multiplier 16, and the resultant output of the 2nd multiplier 16 is applied as the other input to the subtractor 17. The resultant output of the subtractor 17 is fed back to the 2nd local oscillator 4 through the loop filter 18. Thus, the 1st multiplier 15, 2nd multiplier 16, the subtractor 17 and the loop filter 18 constitute a negative feedback loop in which the phase difference between the second intermediate-frequency signal applied to the 1st and 2nd phase detectors 7 and 8 and the output of the reference oscillator 9 is detected to control the 2nd local oscillator 4, so that the phase difference between the second intermediate-frequency signal and the output of the reference oscillator 9 can be maintained to be constant. Such a phase-difference detecting operation is described in detail in Japanese Unexamined Patent Publication No. 197944/83 cited above and will not be especially explained herein. The reference oscillator 9 is preferably an oscillator such as a crystal oscillator which oscillates at a satisfactorily stable frequency. When such an oscillator is used as the reference oscillator 9, the frequency of the second intermediate-frequency signal is stabilized by the function of the negative feedback loop. Therefore, even when the frequency of the output of the 1st local oscillator 2 may drift due to, for example, temperature variations, the frequency of the second intermediate-frequency signal is maintained constant without deviation from the center frequency of the band-pass filter 6 so that the demodulation characteristics can be stabilized.

When one of the inputs of each of the 1st and 2nd multipliers 15 and 16 has a sufficient limiter effect, the operation is the same as that described above even when the signals derived from the outputs of the 1st and 2nd phase detectors 7 and 8 are used in lieu of the signals derived from the outputs of the 1st and 2nd comparators 11 and 12.

Figure 2:
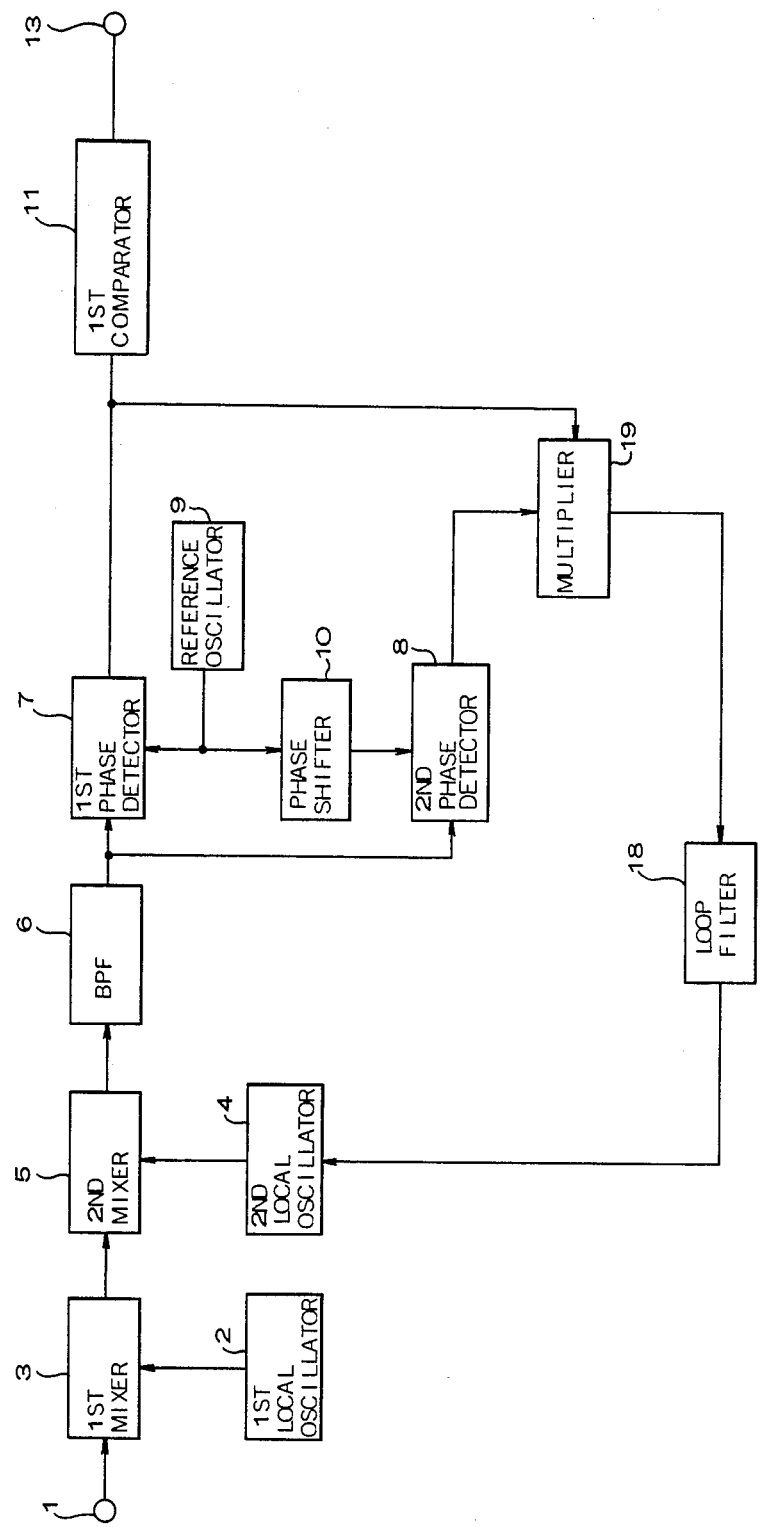
FIG. 2 is a block diagram showing the structure of a second embodiment of the present invention.

FIG. 2 shows a second embodiment of the present invention which is adapted for demodulation of a 2-phase PSK signal. This second embodiment is a modification of the first embodiment shown in FIG. 1, and the same reference numerals are used to designate the same or equivalent functional parts appearing in FIG. 1. The PLL circuit shown in FIG. 2 includes a single multiplier 19. A 2-phase PSK signal applied to the input terminal 1 is converted into a signal having a second intermediate frequency, and such a signal is applied to the 1st and 2nd phase detectors 7 and 8 through the band-pass filter 6. In the 1st phase detector 7, the phase of the input signal is compared with that of the output of the reference oscillator 9, while, in the 2nd phase detector 8, the phase of the input signal is compared with that of the output signal of the 90° phase shifter 10 which shifts by 90° the phase of the output of the reference oscillator 9. The resultant outputs of the 1st and 2nd phase detectors 7 and 8 are applied to the multiplier 19 to be multiplied, and the resultant output of the multiplier 19 is fed back to the 2nd local oscillator 4 through the loop filter 18. As a result, the frequency of the output of the 2nd mixer 5 having the second intermediate frequency becomes equal to that of the output of the reference oscillator 9, thereby stabilizing the PLL characteristics of the demodulation circuit.

Although the output of the 1st phase detector 7 is applied as one of the inputs to the multiplier 19, the operation and effects are similar to those described above even when the output of the 1st comparator 11 is applied as such an input.

Figure 3:
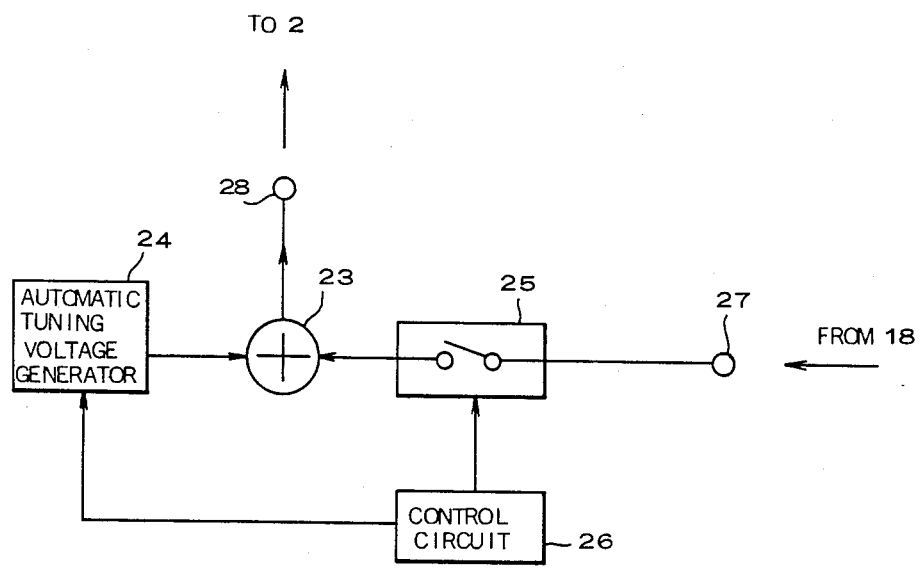
FIG. 3 is a block diagram showing the structure of part of a third embodiment of the present invention.

Such a practical embodiment of the present invention that the second local oscillator 4 shown in FIGS. 1 and 2 has an automatic tuning function will be explained hereinafter. FIG. 3 is a block diagram showing the structure of part of a modification of the second embodiment shown in FIG. 2. Referring to FIG. 3, the modification includes an adder 23, an automatic tuning voltage generator 24 for controlling the local oscillator 2 for the station selection purpose, a switch 25, a control circuit 26, a control voltage input terminal 27 and a control voltage output terminal 28.

For the selection of a radio station, the switch 25 is opened, and the output voltage of the automatic tuning voltage generator 24 is changed under control of the control circuit 26. The tuning voltage is applied through the adder 23 to the local oscillator 2 to control the local oscillator 2 for selecting the desired radio station. Thereafter, the switch 25 is closed under control of the phase-error-indicative control output voltage of the loop filter 18, and this control voltage is added in the adder 23 to the tuning voltage to control the local oscillator 2 by the output of the adder 23. Thus, the automatic tuning selection and demodulation can be stably effected.

Therefore, according to the aforementioned embodiments of the present invention, the frequency of the intermediate-frequency signal in the heterodyne receiver can be stabilized so that stable baseband demodulation can be achieved without causing any excess or shortage of demodulated sidebands attributable to the provision of the frequency-fixed band-pass filter.

Also, since the frequency of the intermediate-frequency signal can be stabilized, compensation to deal with frequency variations of the output of the 90° phase shifter, as disclosed in Japanese Unexamined Patent Publication No. 136160/83 cited above, becomes also unnecessary.

A fourth embodiment of the present invention will now be described in detail with reference to FIG. 4. In this fourth embodiment, a double heterodyne system generating two intermediate frequencies is employed to lower the carrier frequency for demodulating a 4-phase PSK signal multiplexed with another signal such as an FM signal in a time division mode.

Figure 4:
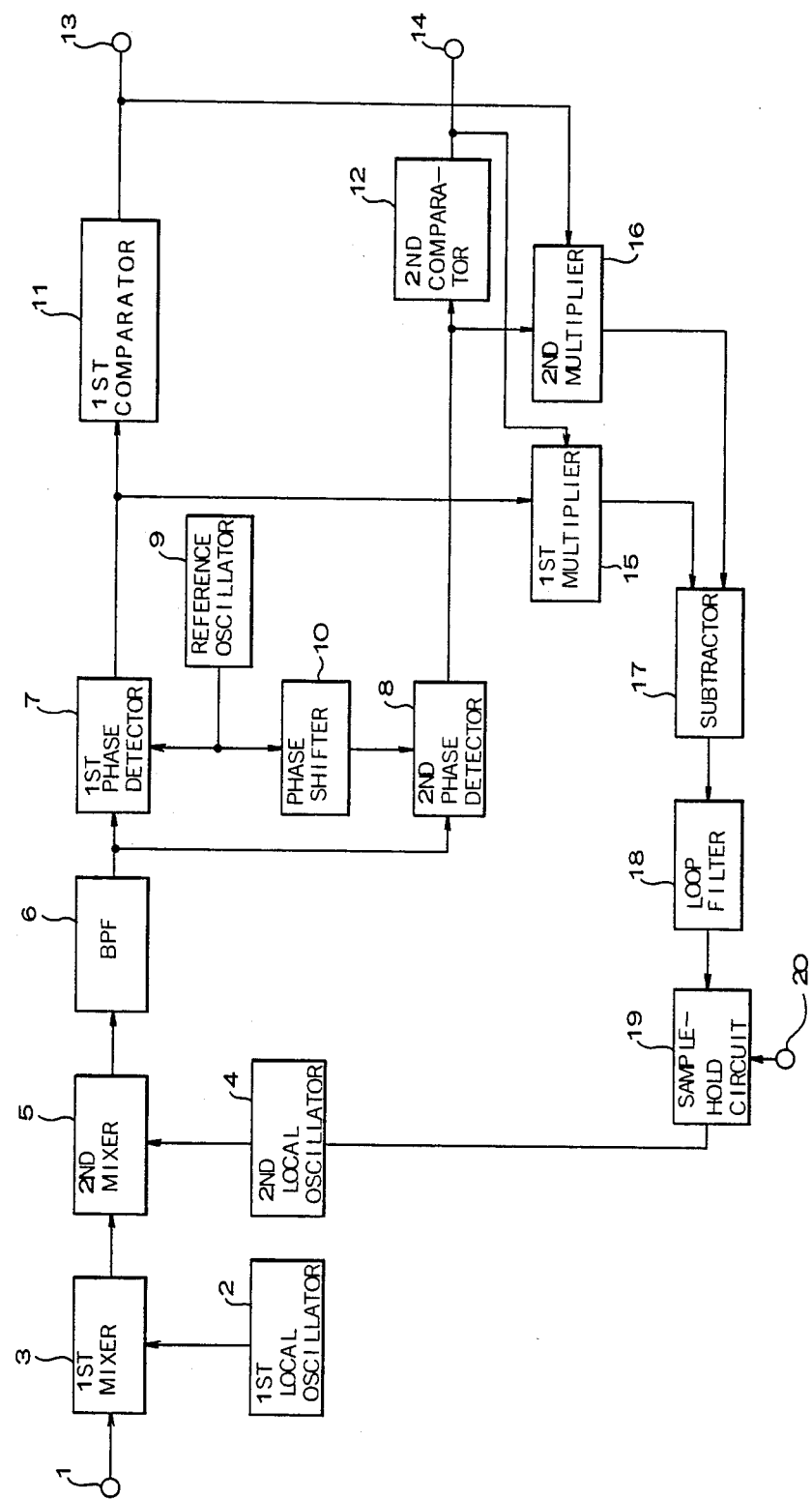
FIG. 4 is a block diagram showing the structure of a fourth embodiment of the present invention.

Referring to FIG. 4, the PLL circuit comprises an input terminal 1, a 1st local oscillator 2, a 1st mixer 3, a 2nd local oscillator 4, a 2nd mixer 5, a band-pass filter 6, a 1st phase detector 7, a 2nd phase detector 8, a reference oscillator 9, a 90° phase shifter 10, a 1st comparator 11, a 2nd comparator 12, a 1st demodulated signal output terminal 13, a 2nd demodulated signal output terminal 14, a 1st multiplier 15, a 2nd multiplier 16, a subtractor 17, a loop filter 18, a sample-hold circuit 19 and a control input terminal 20 of the sample-hold circuit 19.

During the period of time in which a 4-phase PSK signal in a time-division multiplexed signal is applied to the input terminal 1, the sample-hold circuit 19 is placed in its sampling mode under control of a control signal applied to its control input terminal 20, and the feedback loop is closed. The input signal applied to the input terminal 1 is applied to the 1st mixer 3 together with an oscillation output signal of the 1st local oscillator 2 to be beaten down in the 1st mixer 3, and an output signal having a first intermediate frequency appears from the 1st mixer 3. The signal having the first intermediate frequency is applied from the 1st mixer 3 to the 2nd mixer 5 together with an oscillation output signal of the 2nd local oscillator 4 to be beaten down in the 2nd mixer 5, and an output signal having a second intermediate frequency appears from the 2nd mixer 5. The output signal of the 2nd mixer 5 is applied to the band-pass filter 6 where the signal is subjected to waveform equalization so as to eliminate unnecessary out-band noise, interference, etc. and to optimize the characteristics of the transmission line. Such an output signal of the band-pass filter 6 is applied to the 1st and 2nd phase detectors 7 and 8. An oscillation output signal of the reference oscillator 9 is applied directly to the 1st phase detector 7 to be used for coherent detection of the input signal applied to the 1st phase detector 7. The oscillation output signal of the reference oscillator 9 is applied also to the 2nd phase detector 8 through the 90° phase shifter 10 to be used for coherent detection of the input signal applied to the 2nd phase detector 8. As a result, baseband signals representing the phase of 0° and the phase of 90° appear from the 1st and 2nd phase detectors 7 and 8 respectively. These signals are discriminated as +1 or −1 in the 1st and 2nd comparators 11 and 12, and the corresponding binary digital signals appear at the 1st and 2nd demodulated signal output terminals 13 and 14 respectively. In the meantime, the output of the 1st phase detector 7 and the output of the 2nd comparator 12 are applied to the 1st multiplier 15, and the resultant output of the 1st multiplier 15 is applied as one of inputs to the subtractor 17. Similarly, the output of the 2nd phase detector 8 and the output of the 1st comparator 11 are applied to the 2nd multiplier 16, and the resultant output of the 2nd multiplier 16 is applied as the other input to the subtractor 17. The resultant output of the subtractor 17 is negatively fed back to the 2nd local oscillator 4 through the loop filter 18 and sample-hold circuit 19. Thus, when the sample-hold circuit 19 is placed in its sampling mode in response to the application of the control signal to the control input terminal 20, the 1st multiplier 15, 2nd multiplier 16, subtractor 17 and loop filter 18 constitute a negative feedback loop in which the phase difference between the second intermediate-frequency signal applied to the 1st and 2nd phase detectors 7 and 8 and the output of the reference oscillator 9 is detected, and the detected phase difference or error is fed back to the 2nd local oscillator 4, so that the phase difference between the second intermediate-frequency signal and the output of the reference oscillator 9 can be maintained constant. Such a phase-difference detecting operation is described in detail in Japanese Unexamined Patent Publication No. 197944/83 cited already and will not be especially explained herein. The reference oscillator 9 is preferably an oscillator such as a crystal oscillator which oscillates at a satisfactorily stable frequency. When such an oscillator is used as the reference oscillator 9, the frequency of the second intermediate-frequency signal is stabilized by the function of the negative feedback loop. Therefore, even when the frequency of the output of the 1st local oscillator 2 may drift due to, for example, temperature variations, the frequency of the second intermediate-frequency signal is maintained constant without deviation from the center frequency of the band-pass filter 6 so that the demodulation characteristics can be stabilized.

Then, when another modulated signal such as an FM signal multiplexed in the time division mode with the 4-phase PSK signal is applied to the PLL circuit or when the carrier disappears, the operation mode of the sample-hold circuit 19 is converted from the sampling mode into the holding mode in response to the application of the control signal to its control input terminal 20. Regardless of the application of the FM signal to the input terminal 1 at that time, an unnecessary interference signal such as beat, which may appear at the output of the subtractor 17 through the outputs of the phase detectors 7 and 8, is not applied as disturbance to the 2nd local oscillator 4, since the sample-hold circuit 19 is now placed in the holding mode. The PLL circuit carries out its demodulating operation stably as soon as the 4-phase PSK signal is then applied intermittently, and the sample-hold circuit 19 is placed in its sampling mode again.

A preamble period for transmitting a reference phase may be present in addition to the period of the 4-phase PSK signal time-division multiplexed with, for example, an FM signal and applied in the form of a burst. In such a case, the samplehold circuit 19 may be placed in the sampling mode in the preamble period too. When there is a constant phase difference between the transmission phase of the preamble period and that of the 4-phase PSK period, a phase shifter is preferably connected to the output of the reference oscillator 9, and the amount of phase shift in the preamble period is preferably selected to differ from that in the 4-phase PSK period, so that the PLL circuit can more quickly and stably carry out its demodulating operation.

When one of the inputs of each of the 1st and 2nd multipliers 15 and 16 has a sufficient limiter effect, the operation is the same as that described above even when the signals derived from the outputs of the 1st and 2nd phase detectors 7 and 8 are used in lieu of the signals derived from the outputs of the 1st and 2nd comparators 11 and 12.

Figure 5:
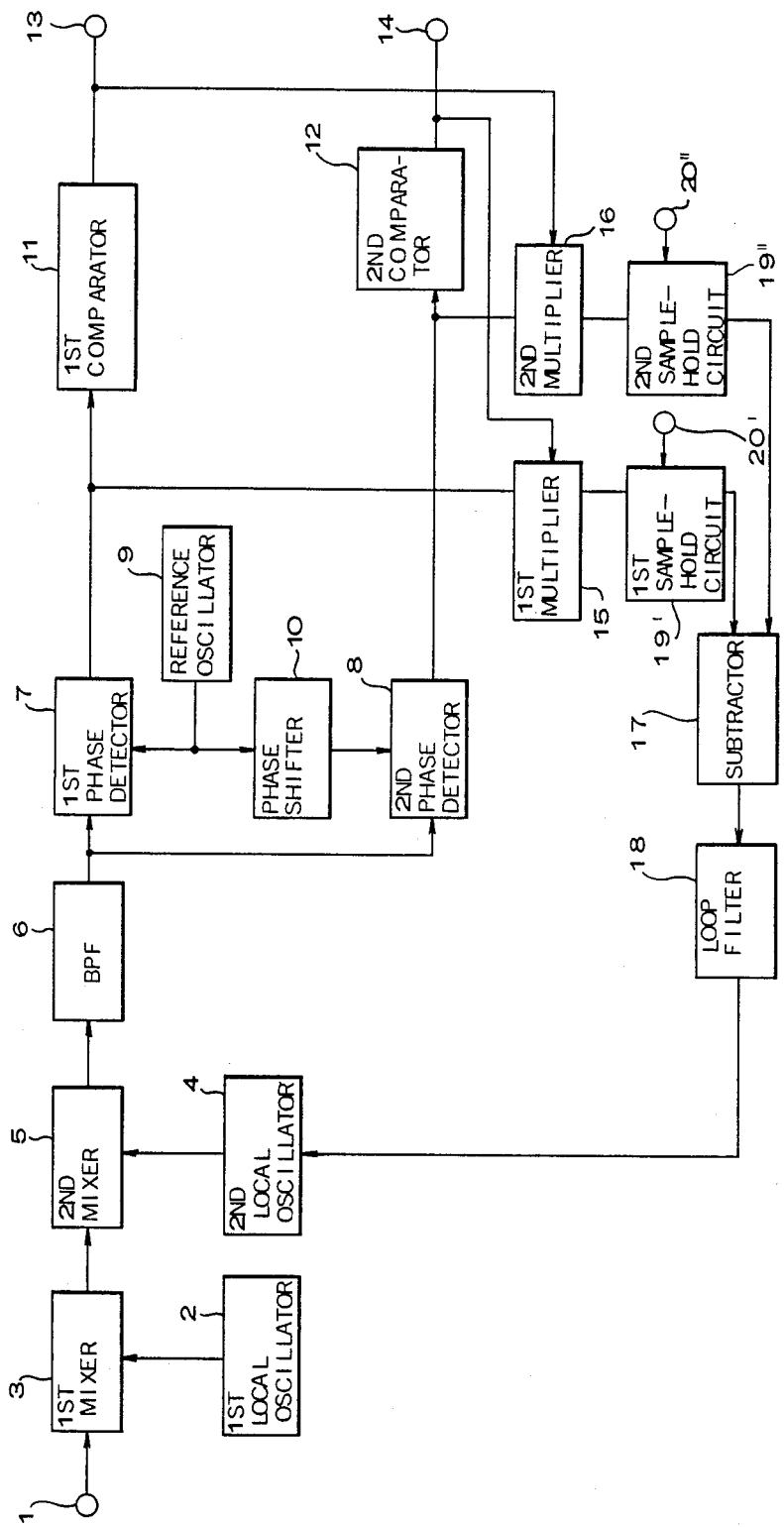
FIG. 5 is a block diagram showing the structure of a fifth embodiment of the present invention.

FIG. 5 shows a fifth embodiment of the present invention. This fifth embodiment shown in FIG. 5 is a modification of the embodiment shown in FIG. 4, and the same reference numerals are used to designate the same or equivalent functional parts appearing in FIG. 4. In FIG. 5, there are two sample-hold circuits 19' and 19" having respective control signal input terminals 20' and 20".

As in the case of the embodiment shown in FIG. 4, a 4-phase PSK signal multiplexed with another modulated signal such as an FM signal in a time division mode is applied to the input terminal 1. During the period of time in which the 4-phase PSK signal or a signal corresponding to a preamble period is applied to the PLL circuit, the samplehold circuits 19' and 19" are placed in the sampling mode. On the other hand, when the FM signal is applied to the PLL circuit, the sample-hold circuits 19' and 19" are placed in the holding mode. Therefore, the 2nd local oscillator 4 is free from disturbance, and, as soon as the 4-phase PSK signal is then applied, the demodulation circuit carries out stably its demodulating operation.

The sample-hold circuits 19, 19' and 19" may be conduction cut-off circuits functioning to cut off signals which may provide a source of disturbance.

Figure 6:
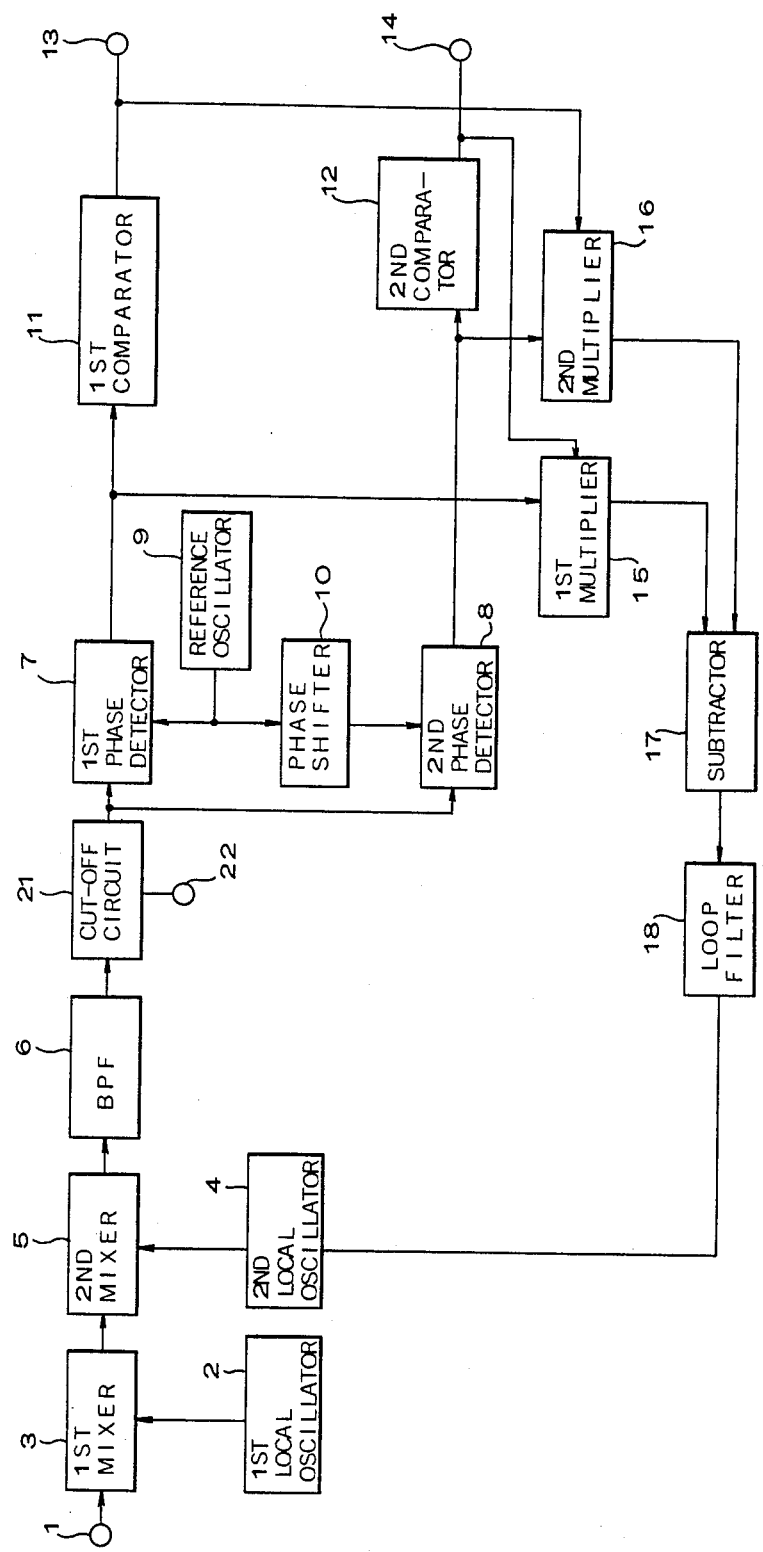
FIG. 6 is a block diagram showing the structure of a sixth embodiment of the present invention.

FIG. 6 shows a sixth embodiment of the present invention. The sixth embodiment shown in FIG. 6 is a modification of the embodiment shown in FIG. 4, and the same reference numerals are used to designate the same or equivalent functional parts appearing in FIG. 4. In FIG. 6, a conduction cut-off circuit 21 having an associated control input terminal 22 is connected to the output of the bandpass filter 6. As in the case of the embodiment shown in FIG. 4, a 4-phase PSK signal multiplexed with another modulated signal such as an FM signal in a time division mode is applied to the input terminal 1. During the period of time in which the 4-phase PSK signal or a signal corresponding to a preamble period is applied to the PLL circuit, the conduction cut-off circuit 21 is placed in its conducting mode. On the other hand, when the FM signal is applied to the PLL circuit, the conduction cut-off circuit 21 is placed in its cut-off mode. Therefore, the output of the 1st and 2nd phase detectors 7 and 8 do not include a signal disturbing the operation of the 2nd local oscillator 4, and the PLL circuit carries out its stable demodulating operation as soon as the 4-phase PSK signal is then applied.

Figure 7:
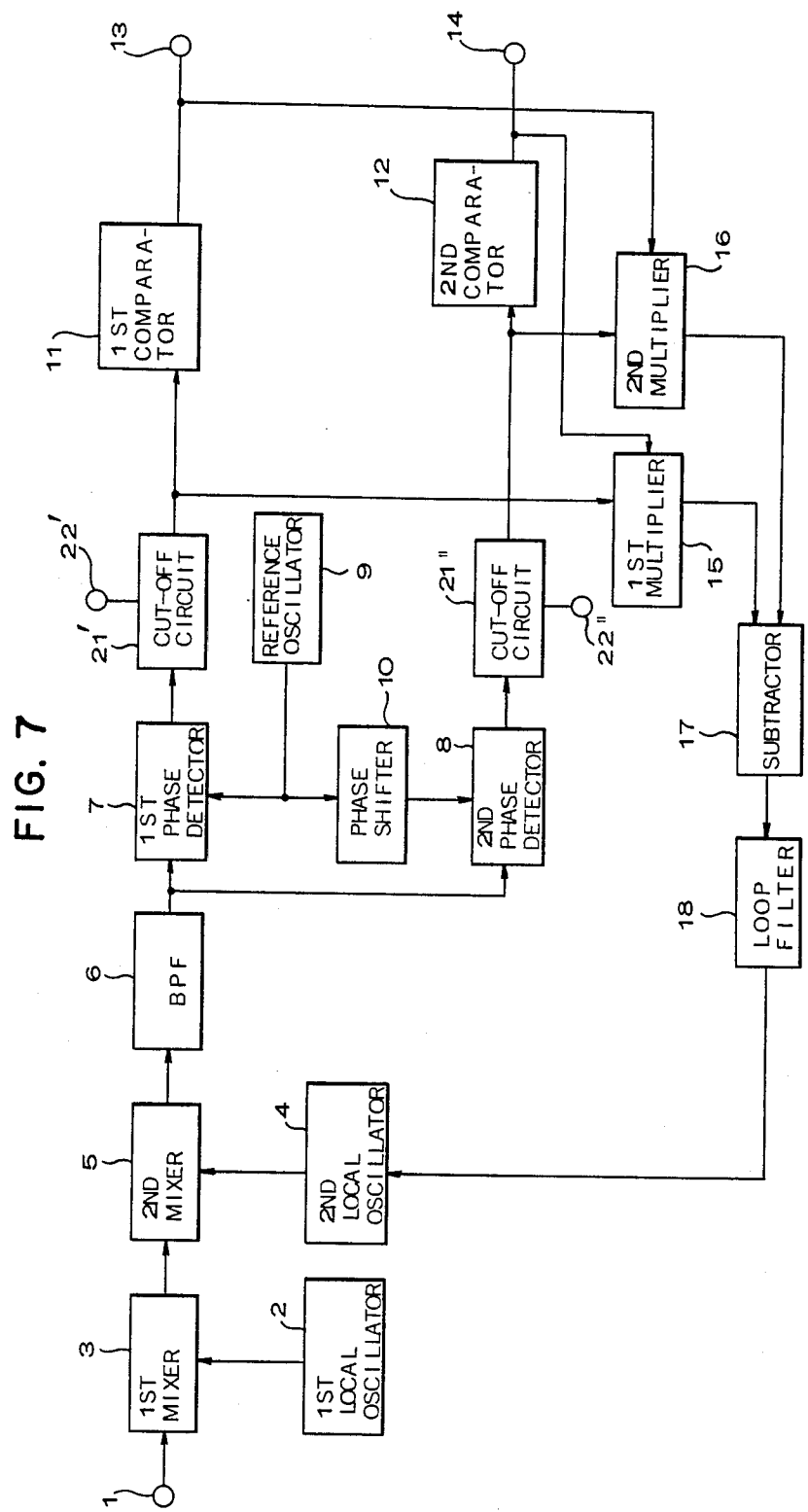
FIG. 7 is a block diagram showing the structure of a seventh embodiment of the present invention.
Figure 8:
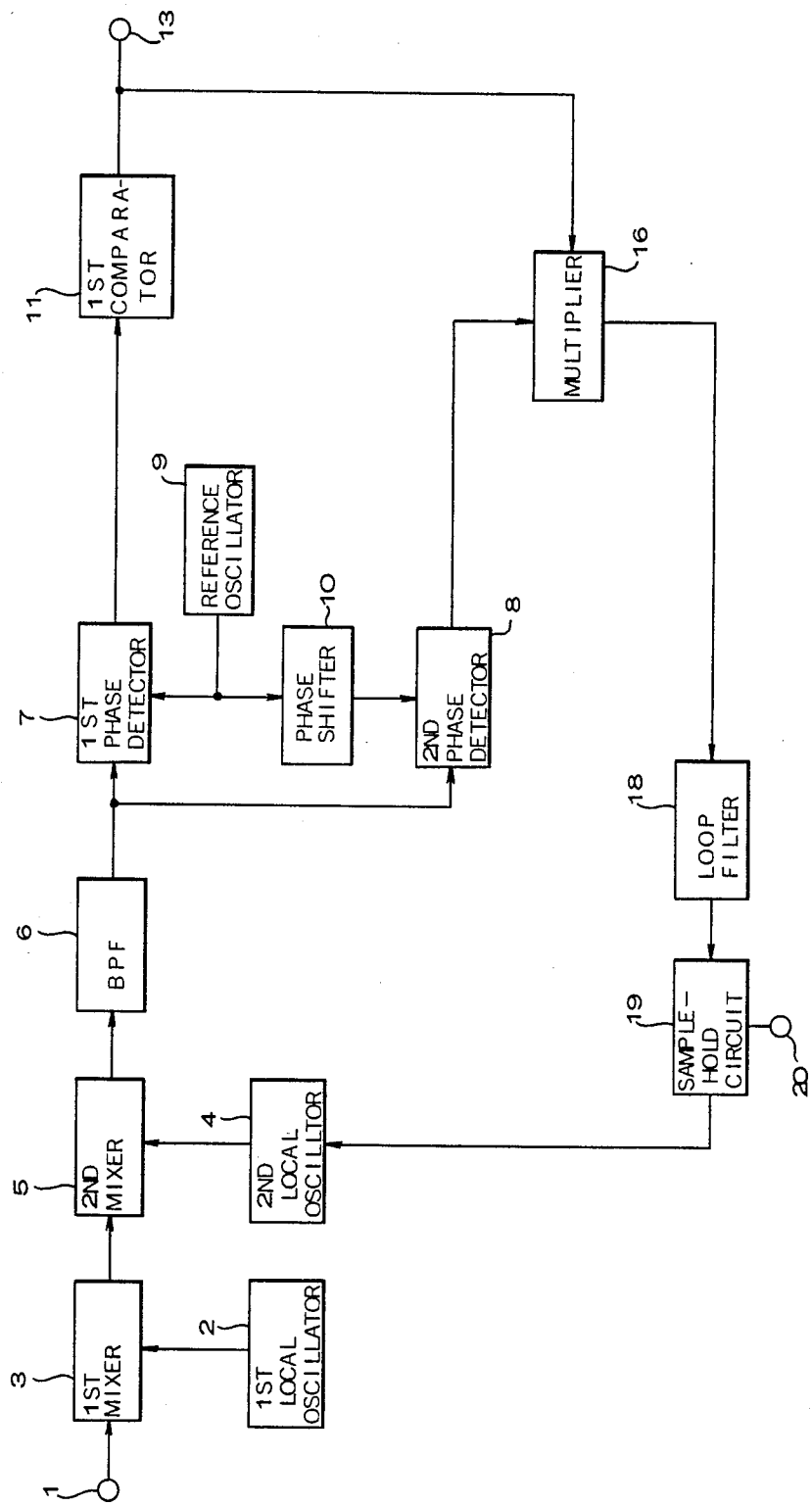
FIG. 8 is a block diagram showing the structure of an eighth embodiment of the present invention.

FIG. 7 shows a seventh embodiment of the present invention. This seventh embodiment is a modification of the embodiment shown in FIG. 4, and the same reference numerals are used to designate the same or equivalent functional parts appearing in FIG. 4. The embodiment shown in FIG. 7 includes two conduction cut-off circuits 21' and 21'' having respective control signal input terminals 22' and 22''. A 4-phase PSK signal multiplexed with another modulated signal such as an FM signal in a time division mode is applied to the input terminal 1. During the period of time in which the 4-phase PSK signal or a signal corresponding to a preamble period is applied to the PLL circuit, the conduction cut-off circuits 21' and 21'' are placed in the conducting mode. On the other hand, when the FM signal is applied to the PLL circuit, the conduction cut-off circuits 21' and 21'' are placed in the cut-off mode. Therefore, the outputs of the 1st and 2nd phase detectors 7 and 8 do not include a signal disturbing the operation of the 2nd local oscillator 4, and the PLL circuit carries out its stable demodulating operation as soon as the 4-phase PSK signal is then applied FIG. 8 shows an eighth embodiment of the present invention adapted for PLL of a 2-phase PSK signal time-division multiplexed with another modulated signal such as an FM signal. This eighth embodiment is a modification of the embodiment shown in FIG. 4, and the same reference numerals are used to designate the same or equivalent functional parts appearing in FIG. 4. An input signal applied to the input terminal 1 is converted into a signal having a second intermediate frequency, and such a signal is applied to the 1st and 2nd phase detectors 7 and 8 through the band-pass filter 6. In the 1st phase detector 7, the phase of the input signal is compared with that of the output of the reference oscillator 9, while, in the 2nd phase detector 8, the phase of the input signal is compared with that of the output signal of the 90° phase shifter 10 which shifts by 90° the phase of the output of the reference oscillator 9. The resultant outputs of the 1st and 2nd phase detectors 7 and 8 are applied to the multiplier 16 to be multiplied, and the resultant output of the multiplier 16 is fed back to the 2nd local oscillator 4 through the loop filter 18 and sample-hold circuit 19. During the period of time in which the 2-phase PSK signal or a preamble signal is applied, the sample-hold circuit 19 is placed in its sampling mode. On the other hand, when the FM signal is applied, the sample-hold circuit 19 is placed in the holding mode. Therefore, the PLL circuit carries out its stable demodulating operation as soon as the 2-phase PSK signal is then applied. As in the case of demodulation of the 4-phase PSK signal, the sample-hold circuit 19 may be connected to the output of the multiplier 16, or the sample-hold circuit 19 may be replaced by a conduction cut-off circuit, or conduction cut-off circuits may be connected to the inputs or outputs of the 1st and 2nd phase detectors 7 and 8 respectively to attain effects similar to those described above.

According to the aforementioned embodiments of the present invention, the intermediate frequency produced in a heterodyne receiver can be stabilized even when a carrier-suppressed double-sideband signal, which is time-division multiplexed with another modulated signal and transmitted in the form of a succession of bursts, is applied to the PLL circuit so that the PLL circuit can stably carry out its demodulating operation.

Figure 9:
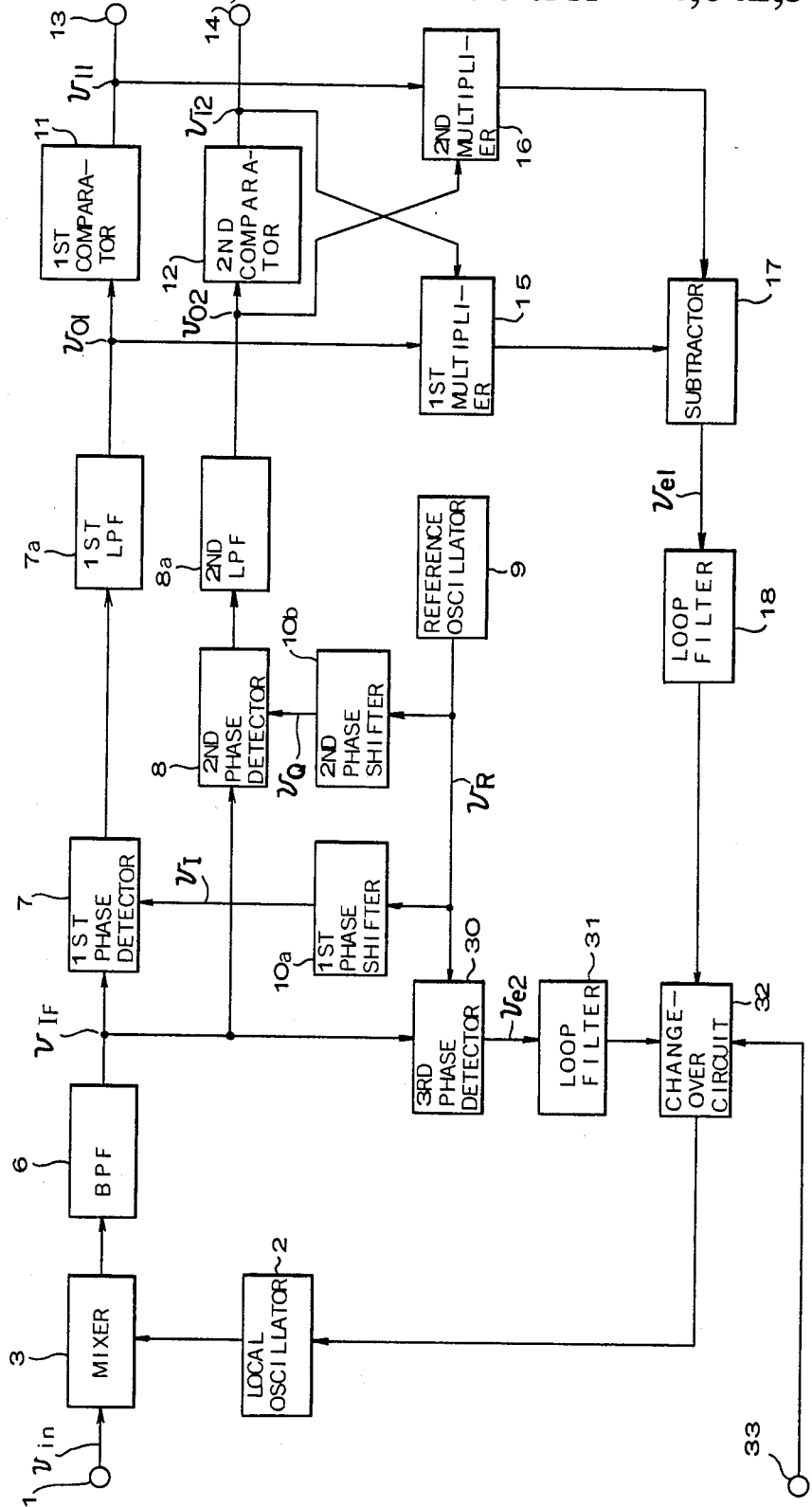
FIG. 9 is a block diagram showing the structure of a ninth embodiment of the present invention.

FIG. 9 shows a ninth embodiment of the present invention. In this ninth embodiment, it is supposed that its input signal is a 4-phase PSK signal representative of a carrier-suppressed double-sideband signal. Referring to FIG. 9, a 4-phase PSK signal Vin applied to an input terminal 1 is converted into a signal $V_{IF}$ having an intermediate frequency IF by the combination of a local oscillator 2, a mixer 3 and a band-pass filter (BPF) 6. It is a first feature of the ninth embodiment of the present invention that a voltage controlled oscillator (VCO) whose oscillation frequency is variable depending on an external input is used as this local oscillator 2, and the local oscillator 2 is controlled in a manner as described below so that a constant intermediate frequency IF can always be obtained regardless of frequency variations of the carrier of the 4-phase PSK signal. The ninth embodiment will be described in detail in relation to such a manner of control.

The 4-phase PSK signal $V_{IF}$ having the frequency converted into the intermediate frequency IF is subjected to coherent detection by the combination of a 1st and a 2nd phase detector 7, 8 and a 1st and a 2nd low-pass filter (LPF) 7a, 8a. An oscillation output signal $V_R$ of a reference oscillator 9 is phase-shifted by $+45°$ and $-45°$ by a 1st and a 2nd phase shifter 10a and 10b to provide signals $V_I$ and $V_Q$ respectively, and such signals $V_I$ and $V_Q$ are applied to the 1st and 2nd phase detectors 7 and 8 respectively for the purpose of coherent detection. A 1st and a 2nd comparator 11 and 12 discriminate the sign of the output signals $V_{01}$ and $V_{02}$ of the 1st and 2nd low-pass filters 7a and 8a respectively. The comparators 11 and 12 generate constant output voltages of positive or negative level when the signals $V_{01}$ and $V_2$ are positive or negative respectively. These output signals $V_{11}$ and $V_{12}$ appear at respective output terminals 13 and 14. Further, the signals $V_{01}$, $V_{02}$ and the signals $V_{11}$, $V_{12}$ are multiplied alternately in a 1st and a 2nd multiplier 16 and 17, and the resultant output signals are applied to a subtractor 17. As a result, a phase error signal $V_{e1}$ indicative of the phase error between the signal $V_{IF}$ and the signals $V_I$ and $V_Q$ is generated from the subtractor 17. Such a manner of phase error detection is known as a Costas loop type detection method, and the output signal $V_{e1}$ of the subtractor 17 is fed back through a loop filter 18 to the local oscillator 2, so that the intermediate frequency IF (the oscillation frequency of the reference oscillator 9) can be maintained constant, as described already.

However, when the input signal Vin is applied in the form of a burst, the length of time required until the phase synchronization is achieved after the application of the input signal Vin poses a problem. This is because the input signal Vin cannot be substantially demodulated during the above period of time, resulting in drop-out of data. Therefore, it is necessary that the period of time required until achievement of the phase synchronization be as short as possible. In this respect, the Costas loop type detection method described above is advantageous in that the steady state characteristic of the signal after achievement of the phase synchronization is excellent. However, the Costas loop type detection method is disadvantageous in that a relatively long period of time is required until achievement of the synchronization since, after detection of a phase error from the outputs of the phase detectors, the signal indicative of the phase error is fed back to the local oscillator. Usually, a data, which is called a preamble word and which may be dropped out, is transmitted prior to the transmission of main data to deal with the above problem. However, the preamble word occupies a limited, very short period of time, and it is considerably difficult to complete the phase synchronization within such a limited period of time.

Therefore, the ninth embodiment of the present invention is so constructed that the phase of the signal $V_{IF}$ and that of the signal $V_R$ are compared directly in a 3rd phase detector 30 to detect a phase error signal $V_{e2}$, and this signal $V_{e2}$ is fed back through another loop filter 31 to the local oscillator 2 thereby achieving the phase synchronization within a short period of time. After completion of the phase synchronization but immediately before the transmission of the main data, the phase error detection loop is changed over by a changeover circuit 32 to the Costas loop for the purpose of signal demodulation. The reason why the phase error detection loop is changed over to the Costas loop is that, since the 4-phase PSK signal is primarily a carrier-suppressed signal, the desired phase error signal cannot be obtained by direct phase detection of the PSK signal. On the other hand, the carrier-suppressed signal is transmitted under a so-called non-modulated state during the preamble period. Therefore, the desired phase synchronization can be simply achieved by a conventional phase locked loop (PLL) during the preamble period. A loop change-over control signal is applied through an input terminal 33 to the loop change-over circuit 32.

Figure 10:
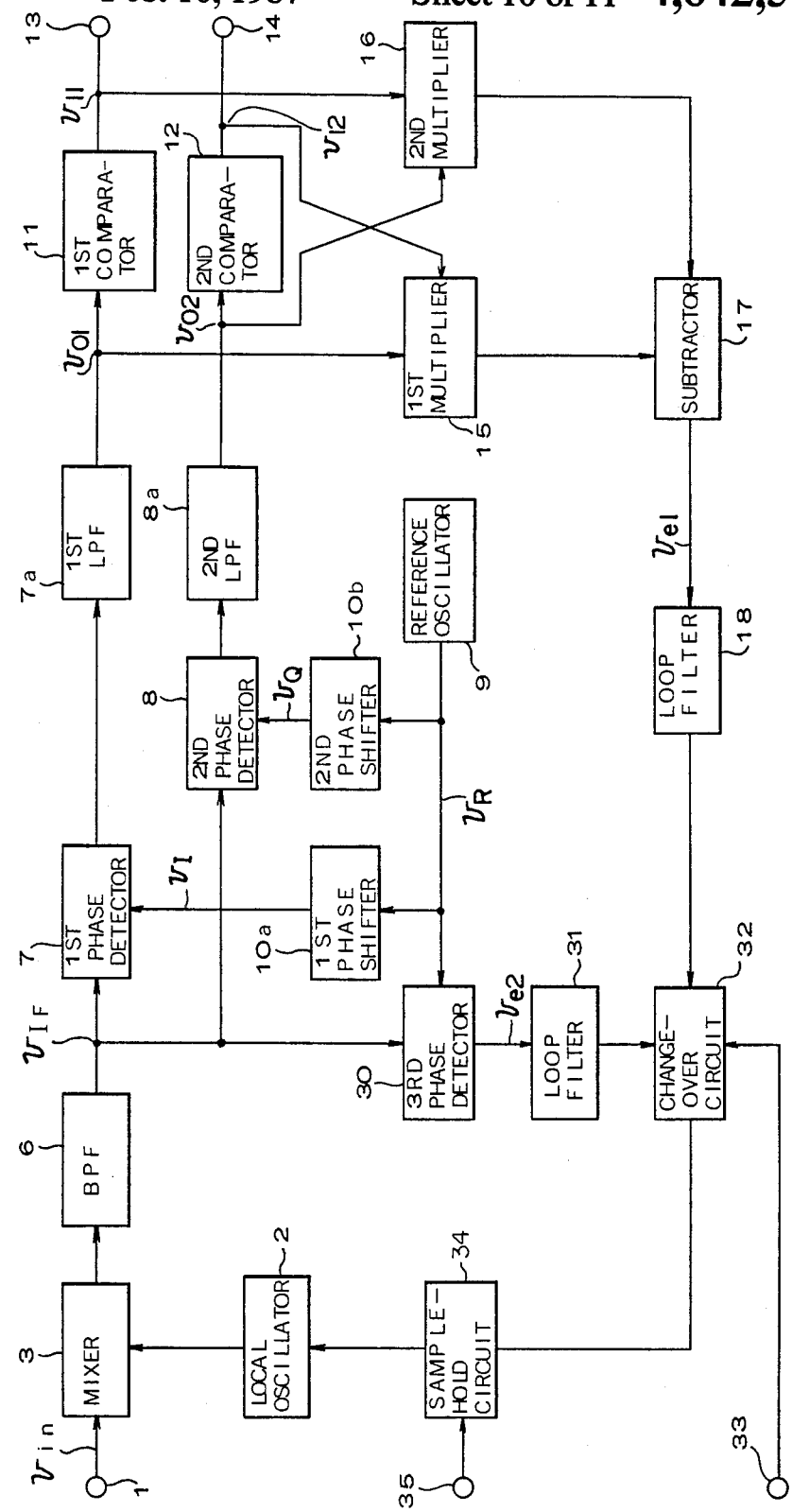
FIG. 10 is a block diagram showing the structure of a tenth embodiment of the present invention.

FIG. 10 shows a tenth embodiment of the present invention which is suitable for demodulation of an input signal Vin when the input signal Vin is a 4-phase PSK signal which is time-division multiplexed with another modulated signal such as an FM signal. The tenth embodiment shown in FIG. 10 is a modification of the embodiment shown in FIG. 9, and the same reference numerals are used to designate the same or equivalent functional parts appearing in FIG. 9. The tenth embodiment includes a sample-hold circuit 34 and an associated control input terminal 35.

When the 4-phase PSK signal is applied to the PLL circuit, the sample-hold circuit 34 applies directly the phase error signal $V_{e1}$ or $V_{e2}$ to the local oscillator 2, while when the FM signal is applied to the PLL circuit, the sample-hold circuit 34 holds the previous value of the phase error signal $V_{e1}$ or $V_{e2}$. Thus, even during the period of time in which the FM signal is applied to the PLL circuit, the phase relationship between the frequency-corrected input signal $V_{IF}$ and the signals $V_R$, $V_I$ and $V_Q$ is substantially maintained in the previous synchronized state, so that the phase synchronization can be achieved within a short period of time when the 4-phase PSK signal is than applied. Thus, the tenth embodiment is advantageous in that the desired phase synchronization is achieved without any substantial delay time even when the FM signal which is, as it were, an interference signal from the aspect of demodulation of the 4-phase PSK signal may be applied in a time-division multiplex mode.

Figure 11:
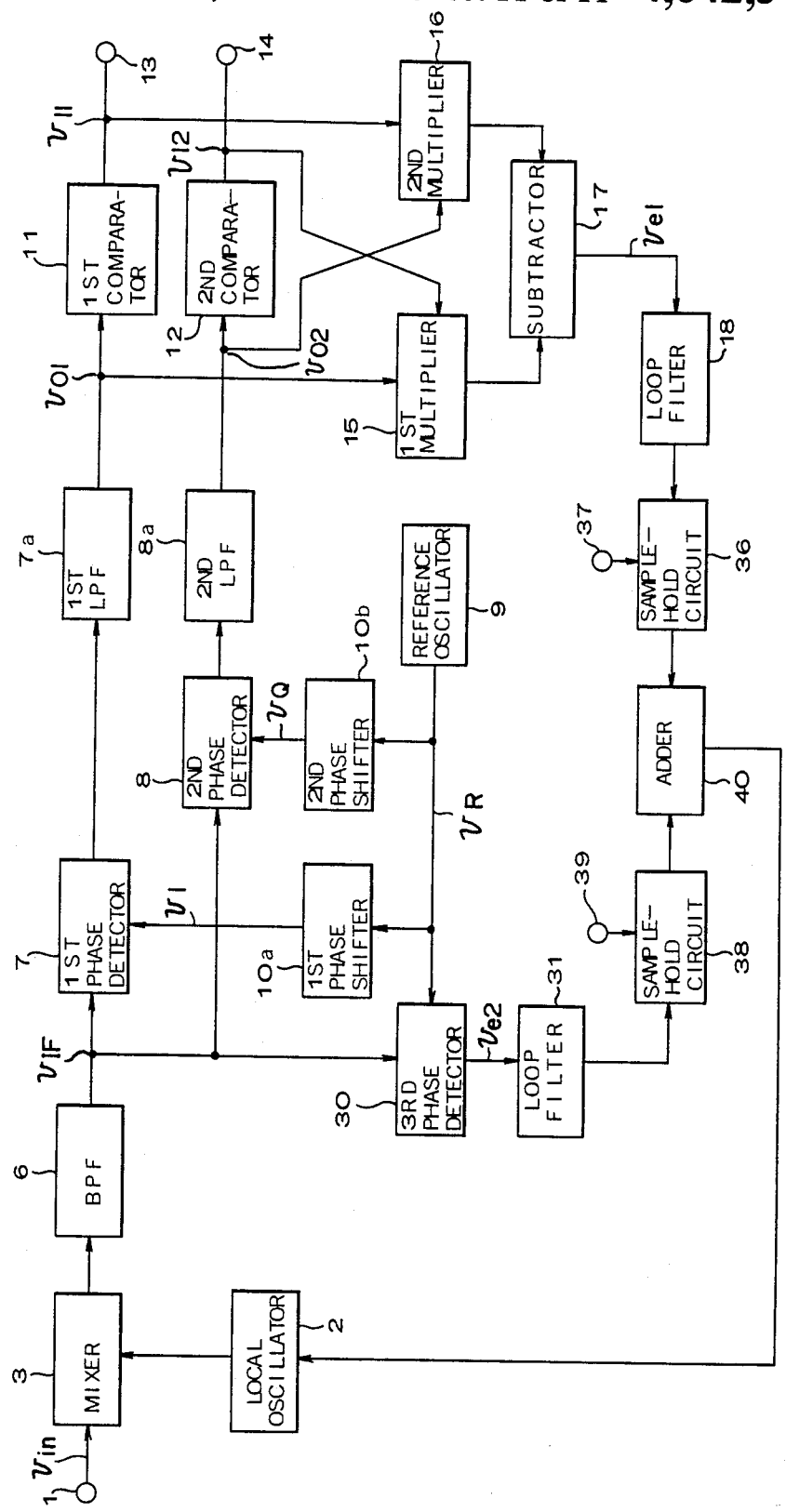
FIG. 11 is a block diagram showing the structure of an eleventh embodiment of the present invention.

FIG. 11 shows an eleventh embodiment of the present invention which is as effective as the embodiment shown in FIG. 10 for achieving the phase synchronization. The eleventh embodiment shown in FIG. 11 is a modification of those shown in FIGS. 9 and 10, and the same reference numerals are used to designate the same or equivalent functional parts appearing in FIGS. 9 and 10. The eleventh embodiment includes a 1st and a 2nd sample-hold circuit 36 and 38, their control input terminals 37 and 39, and an adder 40. During the period of time in which a preamble-word signal preceding a 4-phase PSK signal Vin is applied, the 2nd sample-hold circuit 38 is placed in the sampling mode to close the PLL, and the phase error signal $V_{e2}$ is directly fed back to the local oscillator 2. On the other hand, during the remaining period of time, the 2nd sample-hold circuit 38 is placed in its holding mode thereby opening the PLL. On the contrary, the 1st sample-hold circuit 36 closes the Costas loop during the period of time of application of the 4-phase PSK signal except the preamble period. On the other hand, during the remaining period of time, the 1st sample-hold circuit 36 is placed in its holding mode thereby opening the Costas loop. Therefore, during the period of time of application of the 4-phase PSK signal, either the Costas loop or the conventional PLL is closed to achieve the desired phase synchronization, while, during the period of time of application of the FM signal, both of the loops are opened. Such an operation is entirely the same as that of the tenth embodiment shown in FIG. 10. The only difference therebetween is that the timing of application of the control signals to the control signal input terminals 37 and 39 in FIG. 11 differs from the timing of application of the control signals to the control signal input terminals 33 and 35 in FIG. 10.

These control signals may be obtained by demodulating another modulated signal, for example, the FM signal multiplexed with the 4-phase PSK signal according to the time-division multiplex mode. However, the method of obtaining the control signals in the present invention is in no way limited to that described above.

From the aspect of eliminating interference of another modulated signal, for example, the FM signal with the phase error detection loop, a cut-off circuit may be interposed between the input terminal 1 and the mixer 3 or between the BPF 6 and the phase detectors 7, 8, 30 in, for example, the embodiment shown in FIG. 9 so as to cut off the interference signal. In such a modification, the input signal becomes substantially equivalent to a simple burst signal, and the modification exhibits effects similar those of the embodiments shown in FIGS. 10 and 11. Also, in the embodiment shown in FIG. 11, the 1st sample-hold circuit 36 may be disposed in the succeeding stages of the LPF's 7a and 8a to exhibit similar effects.

The present invention has referred to a PLL circuit demodulating a 2-phase or 4-phase PSK signal. However, it is apparent that the present invention is in no way limited to demodulation of such a specific signal and is also equally effectively applicable to demodulation of all of carrier-suppressed double-sideband signals which can be demodulated by employment of a Costas loop.

It will be understood from the foregoing detailed description of the present invention that, even when a carrier-suppressed double-sideband signal includes a large frequency variation and is transmitted in the form of a succession of bursts, desired phase synchronization of an IF signal obtained by frequency conversion of the input signal can be achieved within a short period of time, so that the PLL circuit can stably carry out its demodulating operation.

We claim:

1. A phase locked loop circuit for receiving a suppressed carrier input signal for use in a heterodyne receiver, comprising a mixer, a local oscillator, a reference oscillator oscillating at a frequency corresponding to an intermediate frequency, a 90° phase shifter, a first and second phase detector, a first and a second comparator, a first and a second multiplier, a subtractor and a loop filter, the operation of said phase locked loop circuit being such that the suppressed carrier input and the output of said local oscillator are applied to said mixer, the output of said mixer is applied to said first and second phase detectors, the output of said reference oscillator is applied directly to said first phase detector and applied through said 90° phase shifter to said second phase detector, the outputs of said first and second phase detectors are applied to said first and second comparators respectively, the output of said first phase detector and the output of said second comparator are applied to said first multiplier, the output of said second phase detector and the output of said first comparator are applied to said second multiplier, the output of one of said first and second multipliers is subtracted in said subtractor from the output of the other, and the resultant output of said subtractor is applied to said local oscillator through said loop filter.

2. A phase locked loop circuit for receiving a suppressed carrier input signal for use in a heterodyne receiver, comprising a mixer, a local oscillator, a reference oscillator oscillating at a frequency corresponding to an intermediate frequency, a 90° phase shifter, a first and a second phase detector, a multiplier device, a loop filter and a sample-hold circuit, the operation of said phase locked loop circuit being such that the suppressed carrier input signal and the output of said local oscillator are applied to said mixer, the output of said mixer is applied to said first and second phase detectors, the output of said reference oscillator is applied directly to said first phase detector and applied through said 90° phase shifter to said second phase detector, the outpus of said first and second phase detectors are applied to said multiplier device, and the resultant output of said multiplier device is applied to said local oscillator through said looper filter and said sample-hold circuit.

3. A phase locked loop circuit for receiving a suppressed carrier input signal for use in a heterodyne receiver as claimed in claim 2, wherein said multiplier device includes a first and a second multiplier, and said phase locked loop circuit further comprises a first comparator and a second comparator and a subtractor, the operation of said phase locked circuit being such that the outputs of said first and second phase detectors are applied to said first and second comparator respectively, the output of said first phase detector and the output of said second comparator are applied to said first multiplier, the output of said second phase detector and the output of said first comparator are applied to said second multiplier, the output of one of said first and second multipliers is subtracted in said subtractor from the output of the other, and the resultant output of said subtractor is applied to said local oscillator through said loop filter and said sample-hold circuit.

4. A phase locked loop circuit for receiving a suppressed carrier input signal for use in a heterodyne receiver, comprising a mixer, a local oscillator, a reference oscillator oscillating at a frequency corresponding to an intermediate frequency, a first and a second phase shifter shifting the phase of the output signal of said reference oscillator by +45° and −45° respectively, a first and a second phase detector, a first comparator and a second comparator, a first and a second multiplier, a subtractor, a third phase detector and a change-over circuit, the operation of said phse locked loop circuit being such that the suppressed carrier input signal and the output of said local oscillator are applied to said mixer, the output of said mixer is applied to said first, second and third phase detectors, the output of said reference oscillator is applied directly to said third phase detector and applied through said first phase shifter to said first phase detector and applied through said second phase shifter to said second phase detector, the outputs of said first and second phase detectors are applied to said first and second comparators respectively, the outputs of said first phase detector and the output of said second comparator are applied to said first miltiplier, the output of said second phase detector and the output of said first comparator are applied to said second multiplier, the output of one of said first and second multipliers is subtracted in said subtractor from the output of the other, and the resultant output of said subtractor and the output of said third phase detector are applied to said change-over circuit changing over between the output signal of said third phase detector and the output signal of said subtractor, the output signal of said change-over circuit being applied to said local oscillator for controlling the oscillation frequency of said local oscillator.

5. A phase locked loop circuit for receiving a suppressed carrier input signal for use in a heterodyne receiver as claimed in claim 4, further comprising a sample-hold circuit, the output signal of said change-over circuit being applied to said local oscillator through said sample-hold circuit.

6. A phase locked loop circuit for receiving a suppressed carrier input signal for use in a heterodyne receiver as claimed in claim 4, wherein said change-over circuit comprises a first and a second sample-hold circuit, and an adder, said first and second sample-hold circuits being connected to the output terminals of said subtractor and said third phase detector respectively, and the output signals of said first and second sample-hold circuits are added in said adder, the output signal of said adder being applied to said local oscillator for controlling said local oscillator.

* * * * *